(12) United States Patent
Ayres (10) Patent No.: US 9,008,334 B2
(45) Date of Patent: Apr. 14, 2015

(54) AUDIO MIXING CONSOLE

(75) Inventor: Richard Ayres, Stevenage (GB)

(73) Assignee: Harman International Industries Ltd., Hertfordshire (GB)

( * ) Notice: Subject to any disclaimer, the term of this patent is extended or adjusted under 35 U.S.C. 154(b) by 341 days.

(21) Appl. No.: 13/364,761

(22) Filed: Feb. 2, 2012

(65) Prior Publication Data

US 2012/0201400 A1  Aug. 9, 2012

(30) Foreign Application Priority Data

Feb. 4, 2011  (EP) .................................... 11153360

(51) Int. Cl.
*H03F 99/00* (2009.01)
*H03M 1/18* (2006.01)
*H03G 7/00* (2006.01)
*H03G 3/30* (2006.01)

(52) U.S. Cl.
CPC ............... *H03G 7/004* (2013.01); *H03M 1/183* (2013.01); *H03G 3/301* (2013.01)

(58) Field of Classification Search
CPC .................................. H03F 99/00; H04R 5/00
USPC ..................... 381/28, 120, 106–107
See application file for complete search history.

(56) References Cited

U.S. PATENT DOCUMENTS

| | | | |
|---|---|---|---|
| 4,192,979 A * | 3/1980 | Jankowski, Jr. .......... | 379/406.06 |
| 5,821,889 A | 10/1998 | Miller ........................... | 341/139 |
| 6,741,194 B1 | 5/2004 | Cassagnes et al. ............ | 341/118 |
| 8,473,291 B2 * | 6/2013 | Matsuo .......................... | 704/233 |
| 2007/0160237 A1 * | 7/2007 | Hibino et al. ................. | 381/119 |
| 2008/0279392 A1 * | 11/2008 | Correia et al. ............... | 381/94.1 |
| 2009/0136062 A1 * | 5/2009 | Wu ............................... | 381/111 |

FOREIGN PATENT DOCUMENTS

| | | | | |
|---|---|---|---|---|
| DE | 199 48 172 A1 | 4/2001 | ............. | H03G 11/04 |
| GB | 2 297 443 A | 7/1996 | ............... | H03G 3/20 |
| WO | 0217496 A1 | 2/2002 | | |
| WO | WO 2006/122389 A1 | 11/2006 | ............... | H03G 3/20 |

OTHER PUBLICATIONS

Extended European Search Report issued in European Patent Application No. 11153360.0, dated Apr. 13, 2011 (7 pgs.).
European Office Action issued in European Patent Application No. 11153360.0, dated Nov. 4, 2011 (5 pgs.).
European Office Action for corresponding Application No. 11 153 360.0, mailed Mar. 21, 2012, 5 pages.

* cited by examiner

*Primary Examiner* — Disler Paul
(74) *Attorney, Agent, or Firm* — Brooks Kushman P.C.

(57) ABSTRACT

An audio mixing console comprises a first amplifier, an analogue to digital converter, a second amplifier and a gain range control unit. The first amplifier may receive an analogue audio input signal and amplify the received audio input signal with a first adjustable gain. The analogue to digital converter may receive the amplified analogue audio input signal and generate a digital audio signal by an analogue to digital conversion of the analogue audio signal. The second amplifier may receive the digital audio signal and amplify the received digital audio signal with a second adjustable gain. The gain range control unit may identify a signal level overload at the analogue to digital converter and control the gain of the first and second amplifiers, respectively.

13 Claims, 7 Drawing Sheets

AUDIO MIXING CONSOLE

PRIORITY CLAIM

This application claims the benefit of priority from European Patent Application No. EP 11 153 360.0 filed Feb. 4, 2011.

TECHNICAL FIELD

The present invention relates to an audio mixing console and to a method for operating an audio mixing console.

RELATED ART

Audio mixing consoles are used in audio systems to receive and mix audio inputs. Overloading an audio input channel of an audio mixing console, particularly an analogue input channel, can result in overload and clipping with its accompanying undesirable side-effects. Clipping occurs when an amplifier attempts to deliver an output signal beyond its maximum capacity. An audio system able to prevent overload of an analogue input stage of an audio mixing console without effecting the overall system gain would be a great practical benefit to consumers.

SUMMARY

An audio mixing console is provided that minimizes an overload situation of an audio input signal input to an audio mixing console while preserving the overall system gain and peak system levels.

According to a first aspect, an audio mixing console is provided. The audio mixing console includes a first amplifier receiving an analogue audio input signal, the first amplifier configured to amplify the received audio input signal with a first adjustable gain. Further, an analogue to digital converter is provided that may receive the amplified analogue audio input signal. The converter being configured to generate a digital audio signal by analogue to digital conversion of the amplified analogue audio signal. Furthermore, a second amplifier is provided to receive the digital audio signal. The second amplifier being configured to amplify the received digital audio signal with a second adjustable gain. The mixing console also may include a gain range control unit configured to identify a signal level overload at the analogue to digital converter. The gain range control unit is also configured to control the gain of the first and second amplifiers, respectively. When the gain range control unit identifies an occurrence of signal level overload, it reduces the first gain, at the first amplifier, by a first amount and increases the second gain, at the second amplifier, by a second amount that is substantially equal to the first amount in order to allow the overall gain of the first and second amplifiers to be substantially preserved. The above-described mixing console allows the system gain and peak signal levels to be preserved in order to minimize the impact on level or balance of any mixes made from a combination of different input signals. Furthermore, with the console an almost totally distortion free environment is possible and it can help to reduce damage to speaker components that could occur in high distortion environments. As the analogue audio input signal is converted to a digital signal the digital signal offers an opportunity to address the signal level overload condition since, in the digital domain automated control of parameters is possible in defined and measured steps. The occurrence of the signal level overload can be determined at the AD (analogue to digital) converter.

In one example the first gain at the first amplifier is reduced directly after identifying the occurrence of a signal level overload. The gain control unit then detects whether the signal overload is still present at the analogue to digital converter. If this is the case the first gain at the first amplifier is further reduced and the second gain at the second amplifier is further increased by a substantially similar corresponding amount until the signal level overload is no longer detected.

In another example the gain range control unit is configured to estimate an amount of signal level overload. In this example, upon detection of a signal level overload condition, the gain range control unit may estimate the projected amount of signal level overload and reduce the first gain at the first amplifier based on the estimated signal level overload. In addition, the second gain may be increased at the second amplifier by a substantially similar amount.

In one example the gain range control unit may identify the signal level overload by determining whether the signal level of the digital audio signal is greater than a predefined first threshold and by determining whether a number of consecutive audio signal samples that exceed the predefined first threshold is greater than a predefined second threshold. The gain range control unit can identify the occurrence of the signal level overload situation when a number of consecutive samples having a signal level above the first threshold is greater than the second threshold. The first threshold and the second threshold, i.e. the maximum signal level and the number of signal samples over the maximum signal level, can be determined by the user. Alternatively or in addition, the maximum signal level and the number of signal samples over the maximum signal level may be determined by the audio mixing console, and/or be automatically varied based on operating conditions such as the frequency of the signal overload condition occurring, the frequency range of the audio signal causing the signal overload condition, or any other parameters related to operation of the audio mixing console.

In the case of a user determined maximum signal level and a number of signal samples over the maximum signal level, the mixing console offers the user a possibility to set his/her own definition of overload within ranges, such as prescribed and defined ranges, or ranges suggested by the audio mixing console. The user can determine according to his/her needs that a signal at or in the AD converter is overloading or is at risk of overloading. The definition of overload may be defined by absolute events such as "two or more consecutive samples above the first threshold", or above "a full-scale deflection" or "two or more samples of greater amplitude than the defined overload threshold". The user can furthermore define parameters such as "how many consecutive overload samples may occur over a given period of time before the gain range control unit reacts by reducing the first gain and by increasing the second gain by the same amount". The determination of parameters that define a signal level overload situation can be helpful for preventing very small samples from triggering the gain range control unit to reduce the first gain in events such as a microphone being dropped. The analogue audio input signal can be a signal coming from a microphone. Especially in wireless microphones, where the initial input gain is frequently set on the transmitter device and where there is no mechanism for the mixing console operator to reduce this gain in the event that audio levels result in overload of the wireless system.

One possibility for determining the signal level overload is the gain range control unit interpolating a signal level evolution of the digital audio signal using a signal level evolution of a predefined number of last detected signal samples. The gain range control unit can then determine by which amount the digital audio signal would have been greater than the predefined first threshold. The gain range control unit can then reduce the first gain by the determined amount, and can increase the second gain by a substantially similar determined amount in order to avoid the signal level at the AD converter being higher than the predefined first threshold. In another example it is also possible that the gain range control unit extrapolates the signal level evolution based on the predefined number of last detected digital audio signal samples. In this situation a future overload may be detected before it actually occurs.

For determining an estimate of the amount that the digital audio signal would have been greater than the predefined first threshold, the gain range control unit may be configured to interpolate the signal level evolution, taking into account parameters of the actual digital audio signal, such as a rise time of the signal level in a predefined number of last signal samples and/or a number of signal samples above the predefined threshold.

In one example the gain range control unit determines the first amount of gain reduction in such a way that the signal level of the digital audio signal at the analogue to digital converter is lower than a predefined peak signal level. This predefined peak signal level can be the signal level where clipping would occur, or can be any other signal level.

The second amplifier may be part of a digital signal processor contained in the console. Alternatively, the second amplifier may be stand alone, or part of any other component or processor included in the console. Furthermore, the AD converter and the second amplifier may be arranged such that the output of the AD converter is directly input into the second amplifier without further signal processing steps in between.

The system also relates to a method for operating an audio mixing console, the method includes the steps of amplifying, by a first amplifier, an analogue audio input signal with a first adjustable gain. The amplified analogue audio input signal is then converted to a digital audio signal by the analogue to digital converter. The digital audio signal can be amplified by a second amplifier directly after the analogue to digital conversion. Furthermore, a signal level overload can be identified at the analogue to digital converter, and the amount of signal level overload may be estimated when a signal level overload condition has been identified. The amount of signal level overload may be estimated and the first gain at the first amplifier may be reduced by a first amount in dependence on the estimated signal level overload, and the second gain at the second amplifier may be increased by substantially the same amount. This method helps to preserve the overall system gain of the first and second amplifiers, and helps to preserve the dynamics of the original signal.

Other systems, methods, features and advantages of the invention will be, or will become, apparent to one with skill in the art upon examination of the following figures and detailed description. It is intended that all such additional systems, methods, features and advantages be included within this description, be within the scope of the invention, and be protected by the following claims.

BRIEF DESCRIPTION OF THE DRAWINGS

The invention may be better understood with reference to the following drawings and description. The components in the figures are not necessarily to scale, emphasis instead being placed upon illustrating the principles of the invention. Moreover, in the figures, like referenced numerals designate corresponding parts throughout the different views.

DETAILED DESCRIPTION OF THE PREFERRED EMBODIMENTS

Figure 1:
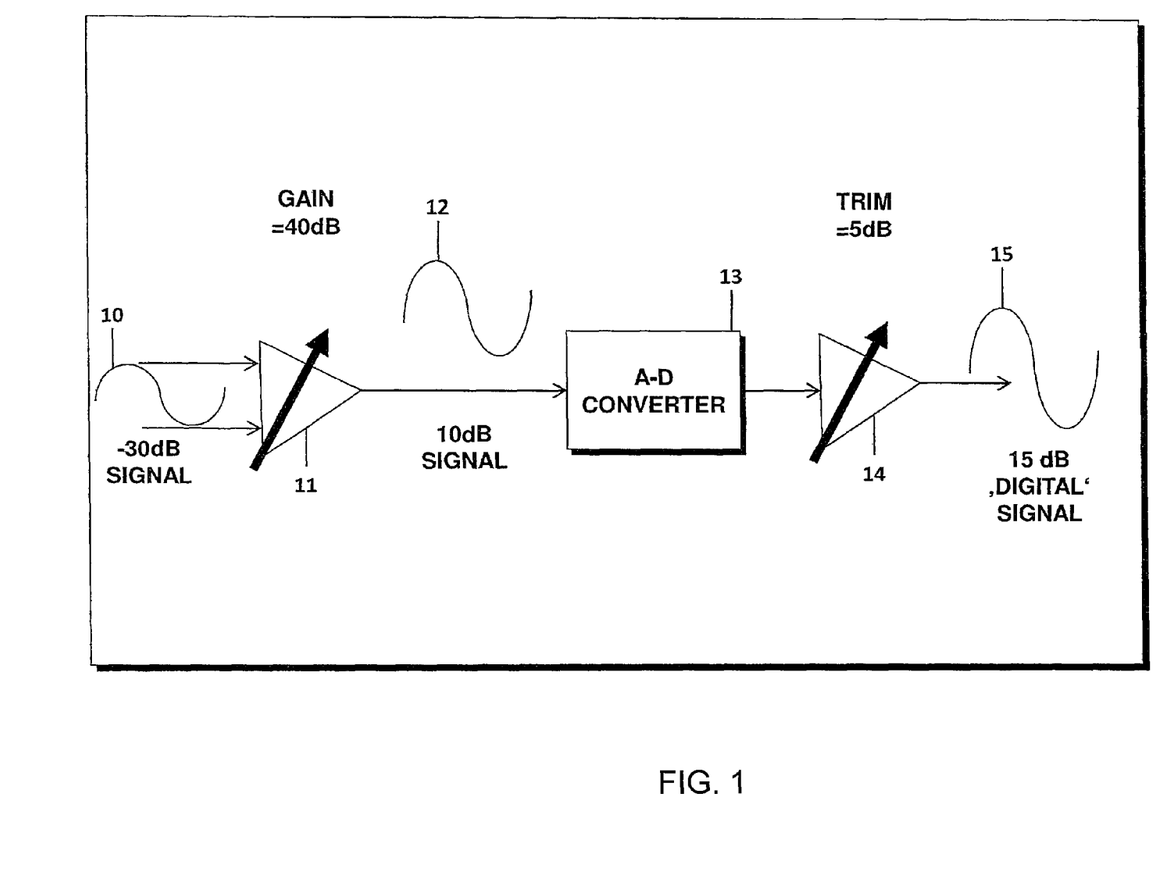
FIG. 1 is an example signal processing circuit for an audio signal in a digital mixing console illustrating example operation where the audio signal level remains below any overload or clipping threshold.

FIG. 1 is an example audio channel processing circuit in an audio mixing console. In the embodiments shown in the Figs. only some of the components of the audio mixing console are provided to facilitate the discussion, other components may be omitted for the sake of clarity. An example audio input signal 10, such as an analog microphone signal, is fed via an input channel of the audio mixing console (not shown) to a first amplifier 11 with an adjustable gain. In the example shown the audio input signal is a −30 dB signal. With the adjustable gain of the first amplifier 11 being set to a value such as 40 dB, an audio output signal 12 of +10 dB is obtained, and is fed to an analogue to digital (A-D) converter 13. The digital audio signal is then transmitted to a second amplifier 14 where a second amplification is carried out, such as 5 dB of amplification resulting in a digital audio signal 15 having 15 dB.

Figure 2:
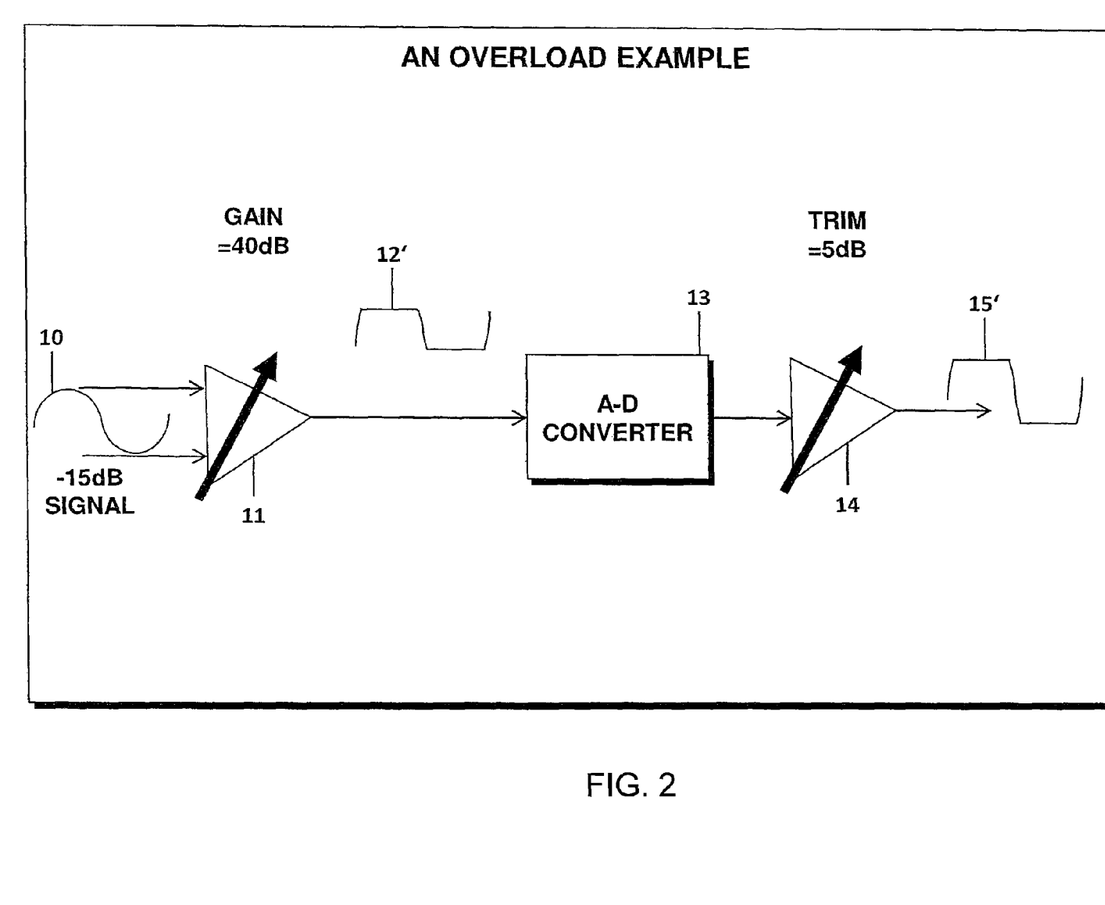
FIG. 2 shows the example signal processing circuit of FIG. 1 during example operation where the audio signal and gain results in an overload or clipping situation.
Figure 3:
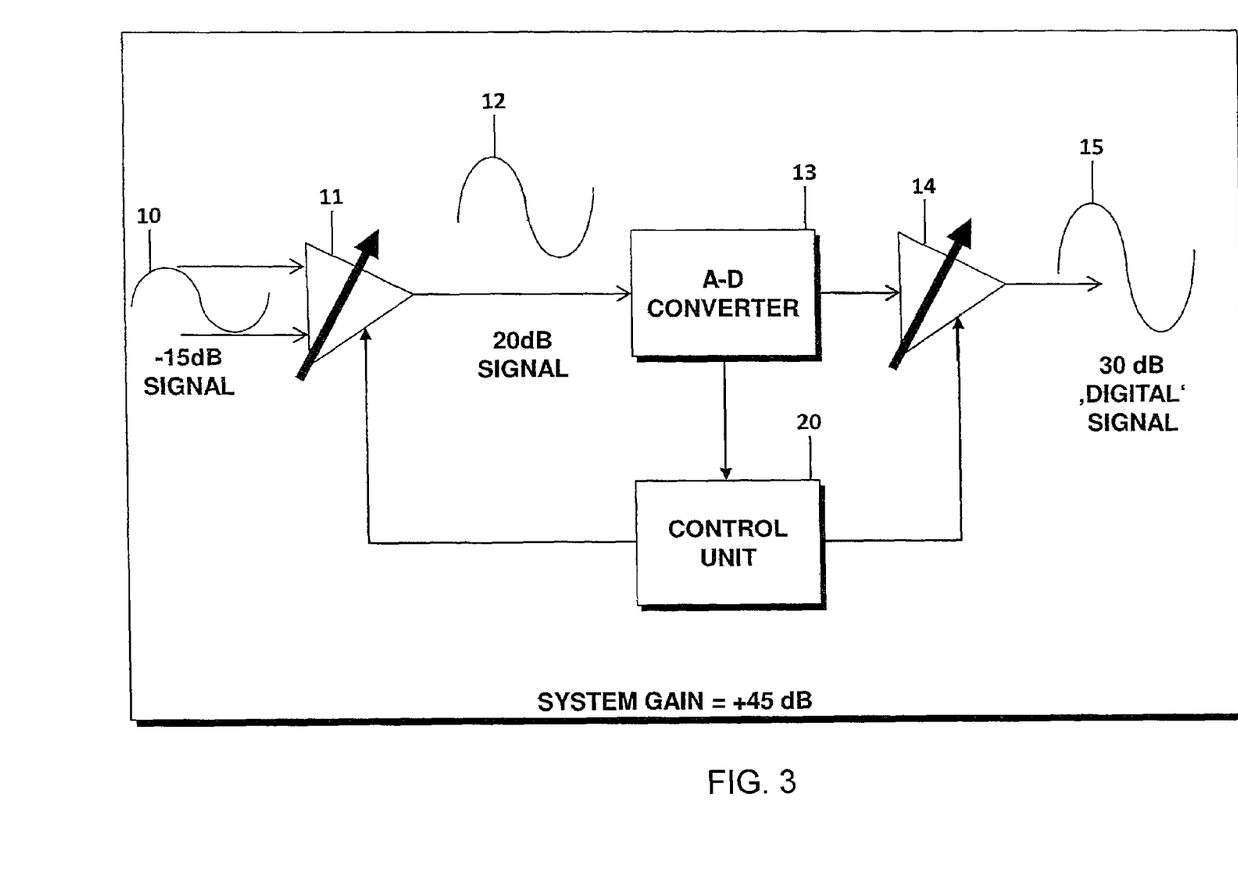
FIG. 3 is an example signal processing circuit for an audio signal in a digital mixing console where the gain range is automatically controlled.

FIG. 2 is an example overload situation during operation of the audio processing circuit of FIG. 1. The audio input signal 10, in the example shown having −15 dB is fed to the first adjustable amplifier 11 where an adjustable gain of 40 dB is applied to the audio input signal 10. The analogue to digital converter 13 may have a maximum input level of +20 dB. With the gain of 40 dB, the audio output signal after the first amplifier 11 attempts to reach +25 dB. However since the AD converter 13 of this example can only process signals at a maximum input level of +20 dB a clipped audio output signal 12' is obtained. After the second amplifier 14, having a gain of 5 dB, the distorted audio signal 15' at 25 dB would be obtained. Prevention of this type of clipping with analogue technologies would be difficult, if not impossible. With analogue systems, detection of overload would be hard to measure and inflexible to changing user needs and requirements. In addition, with fairly rigid system constraints on maximum internal operating levels in analogue systems (for example, approximately 21 dBu, where dBu indicates that the reference quantity is 0.775 Volts RMS (root mean square)) and minimum noise floor (of approximately 86 dBu). There is little scope to replace any gain that can be taken away from the input amplifier to restore the required overall system gain. Further problems arise in the analogue domain since it is frequently difficult, if not impossible, to automate any change in gain without significant cost FIG. 3 is an example audio channel processing circuit included in the audio mixing console where the overload situation discussed above in connection with FIG. 2 can be avoided. The audio mixing console is a digital mixing console with a digital signal processor, DSP (not shown), for processing the audio signals. In such a digital mixing console a plurality of audio input signals, such as input signal 10, may be processed and mixed or combined to a single output, or multiple outputs. Furthermore, the input signals may be routed and processed through the console to a plurality of output channels, or points of the console via different processing routes. This means that the different input signals are routed to different output points and different processing routes are used for the different input signals to the different output points of the console.

The audio input signal 10 with a signal sound pressure level of, for example, −15 dB is input into the first amplifier 11 where the signal should be amplified with a gain of +40 dB resulting in an amplified signal 12 of 25 dB. However, as the maximum input level of the AD converter 13 in this example is 20 dB, clipping would occur. This overload situation is detected by a gain range control unit 20 which detects an overload situation at the AD converter 13. The term "unit" may be defined to include one or more executable modules. As described herein, the units are defined to include software, hardware or some combination thereof executable by a processor. Software modules included in the units may include instructions stored in memory that are executable by the processor. Hardware modules included in the units may include various devices, components, circuits, gates, circuit boards, and the like that are executable, directed, and/or controlled for performance by the processor.

A user of the system shown in FIG. 3 can define rules or parameters to determine when overloading can occur at the AD converter 13. For example, a peak signal level may be set as a first threshold. In addition, a second threshold can be set, such as a number of samples with a signal level higher than the first threshold. Based on these parameters an overload situation may be detected by the gain range control unit 20. By way of example, if two or more consecutive samples at full-scale deflection are detected, an overload situation may exist. In the AD converter 13 a full-scale deflection occurs when the audio signal has reached the maximum representable value. In other examples, any other parameters may be used to determine/detect an overload situation. In addition, in other examples, the console may define or suggest rules or parameters automatically based on operation.

If the control unit 20 now has detected an overload situation at the AD converter 13, the control unit 20 can control the first amplifier 11 by instructing the first amplifier to reduce it's adjustable gain in order to avoid the overload situation. In the example shown, the control unit 20 may reduce the +40 dB adjustable gain setting of the first amplifier 11 to +35 dB analogue gain resulting in a 20 dB audio signal 12. The amplified audio output signal 12 can then be processed by the AD converter 13 without clipping. In addition, the control unit 20 can instruct the second amplifier 14 to increase the amplification by a substantially similar amount, in this example +5 dB. Thus, instead of the originally intended +5 dB digital amplification by the second amplifier 14, the amplification by the second amplifier may be +10 dB resulting in a 30 dB digital signal 15 at the output.

In the example of FIG. 3, the input gain control of first amplifier 11 may occur automatically, however, the principle discussed above can also be used on systems with manually adjustable gain controls in which the control unit 20 is used to advise an operator of the audio mixing counsel on a recommended action, such as by providing a preliminary indication of an overload situation.

The second amplifier 14 can be contained in the DSP of the console, whereas the AD converter 13 and the first amplifier 11 may not be part of the DSP. In one example, amplification or compensation by the second amplifier 14 may occur in the DSP immediately after receipt of the digital signal directly from the AD converter 13. This can mean that no other signal processing is carried out between the AD converter 13 and the second amplifier 14. The single input signal 10 shown in FIG. 3 may be routed to a plurality of different output points of the console. Furthermore, it is possible that a plurality of input signals 10 are mixed and routed to a single output point of the console. In addition, a plurality of input signals 10 may be routed to a plurality of output points of the console.

Figure 5:
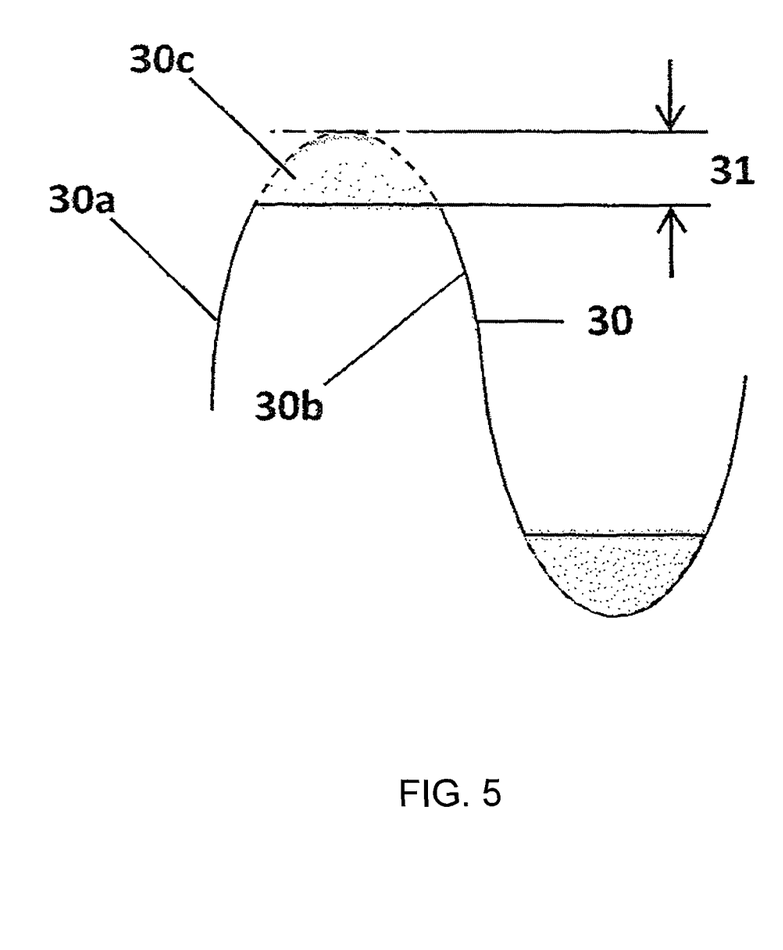
FIG. 5 is an example audio signal processed by an example of the digital mixing console.

In one example, the method for determining a signal level overload by the control unit 20 can be based on interpolation. FIG. 5 is an example of a signal level overload of an audio signal. In FIG. 5 an audio signal 30 is shown for which an overload situation would occur at the analogue to digital converter. Based on the rise time at sections 30a and 30b and based on the number of signal samples at full-scale deflection in section 30c the control unit can determine an estimate of the maximum level of the audio signal (as indicated by the dashed lines) ahead of receipt of the actual maximum level of the audio signal by the first amplifier. The amount of signal level overload 31 can be estimated and the amplification of the first amplifier can be reduced by the determined amount of signal level overload. In addition, the gain of the second amplifier can be increased by substantially the same amount that the first amplifier gain is reduced. In the example audio signal shown in FIG. 5, the control unit may use the result of the estimation of the amount of signal level overload to take proactive action. In this example the signal evolution of section 30a may be used to extrapolate the maximum level of the audio signal. In this situation, the system reacts before the overload actually occurs. In another example the overload situation as shown in FIG. 5 may have occurred and the result of the estimation based on sections 30a and 30b of the signal level overload can be used to take reactive action.

Figure 4:
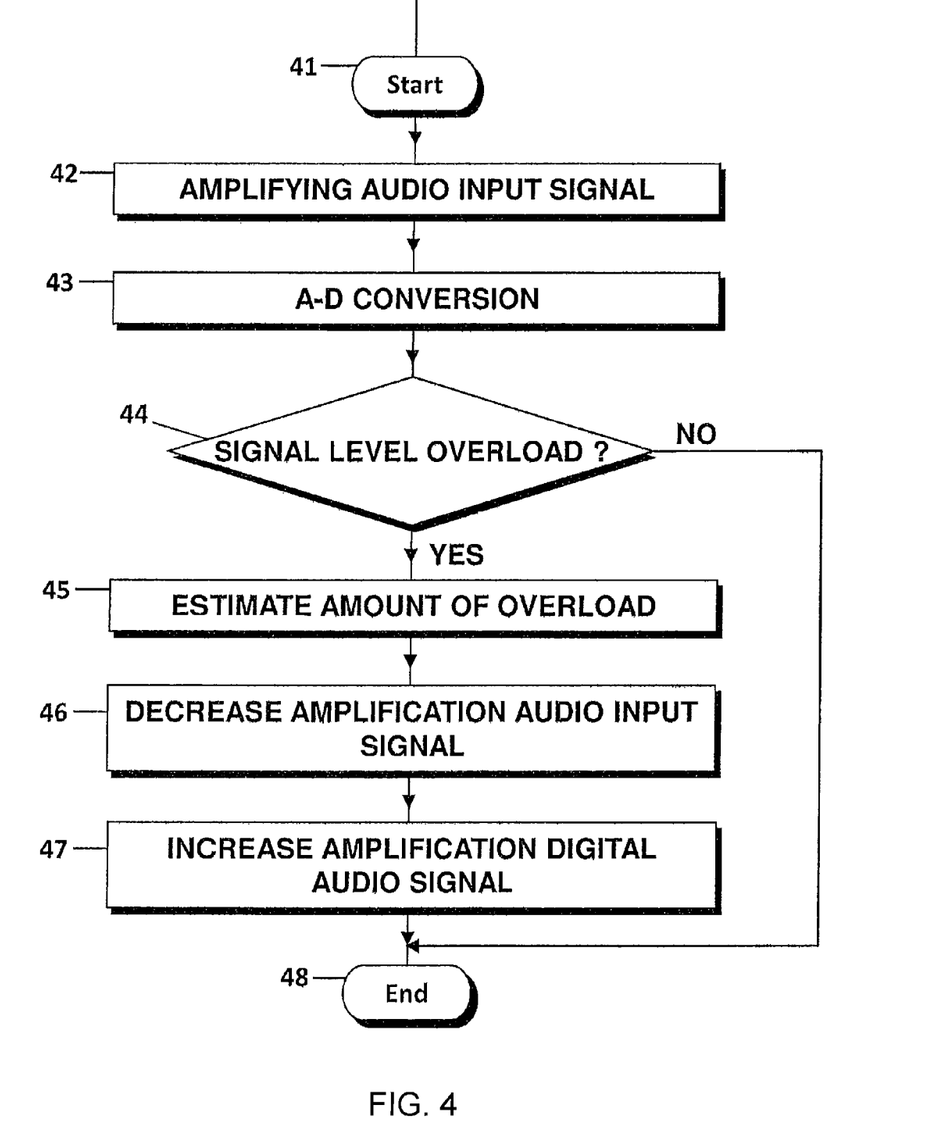
FIG. 4 is an example operational flow diagram of the digital mixing console of FIGS. 1-3.

FIG. 4 is an example operational flow diagram for the audio mixing console. In FIG. 4 the steps for controlling a signal level in the audio mixing console are described with reference to FIG. 3. The method starts in step 41, and in step 42 the audio input signal is amplified at the first amplifier 11. In step 43 the analogue to digital conversion is carried out at AD converter 13. In the next step 44 the gain range control unit 20 determines whether a signal level overload situation can be identified. In one example, a signal level overload situation can be detected as was discussed in connection with FIG. 5. If a signal level overload has been detected the amount of signal level overload is estimated in step 45. In the next step 46 the amplification of the audio input signal 10 at the first amplifier 11 is reduced in such a way that the overload is avoided. In addition, in step 47 the amplification of the digital audio signal at the second amplifier 14 is increased by about the same amount. If no signal overload situation is detected in step 44, changes to the gains of the respective two amplification stages is not necessary and the audio signal can be further processed without any additional steps. The method ends in step 48.

In the example of FIG. 4 the amount of signal level overload was estimated before the system i.e. the gain range control unit reacted. In another example estimation of the signal level overload by the gain range control unit 20 can be omitted, and the gain range control unit 20, reduces the gain at the first amplifier 11 by the first amount and increases the gain at the second amplifier 14 by the second amount upon detection of an overload situation. If the overload continues the same process is repeated until the overload situation is not detected anymore. In still another example, an actual overload event is detected, and the gain range control unit 20 reduces the gain at the first amplifier 11 by the first amount and increases the gain at the second amplifier by the second amount in response to clipping by the AD converter 13.

Figure 6:
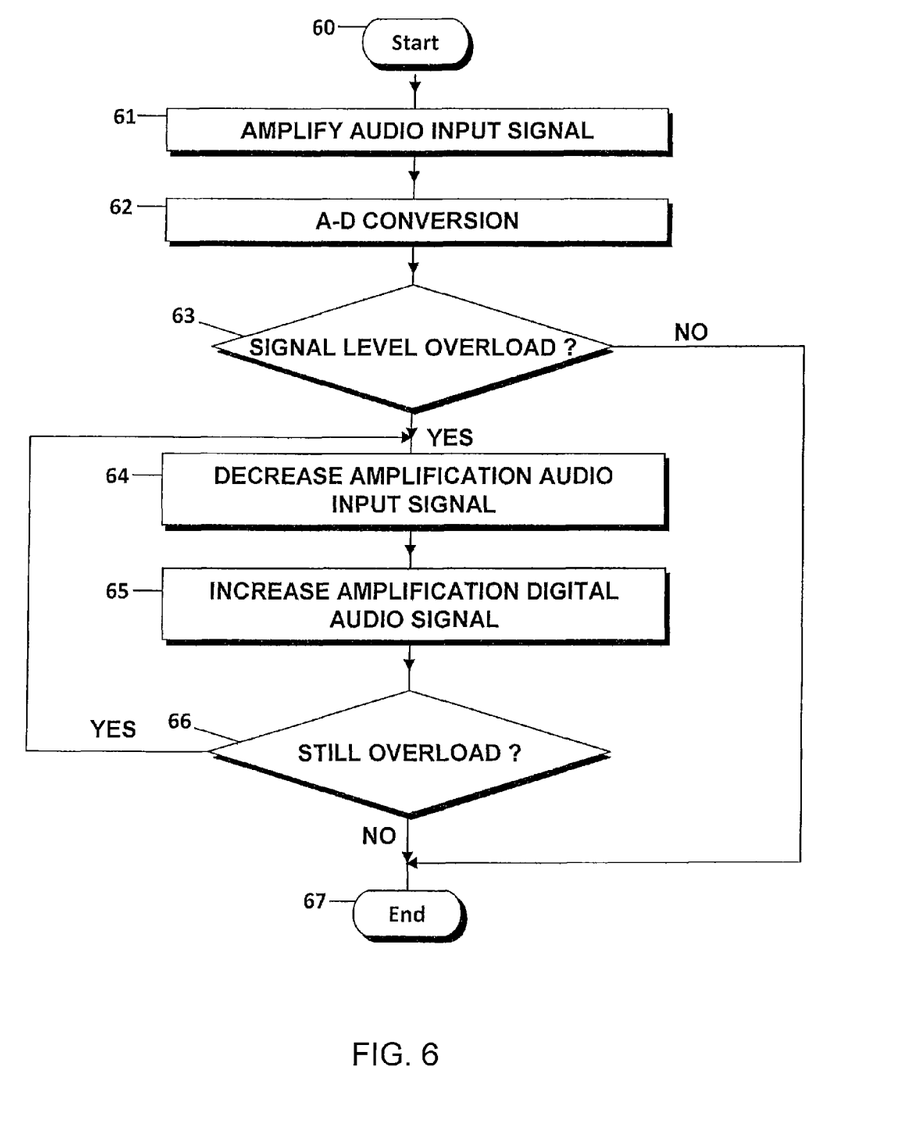
FIG. 6 is an example operational flow diagram of the audio mixing console of FIGS. 1-3.

FIG. 6 is another example operational flow diagram of the audio mixing console. The method starts in step 60. In step 61 the audio input signal is amplified and in step 62 the analogue to digital conversion takes place. These two steps correspond to steps 42 and 43 of FIG. 4. Furthermore, in step 63, it is checked whether an overload situation at the analogue to digital converter exists. If an overload situation is detected, the amount of overload is not estimated as in FIG. 4. Instead, the amplification of the audio input signal is directly decreased by a first amount and the digital audio signal amplification is increased by the second amount (step 65). In the next step 66 it is then checked whether the overload situation still applies. If yes, steps 64 and 65 are repeated until no overload situation is detected at step 66 anymore, the method ending in step 67. In this example, first and second amounts may be predetermined step amounts. Alternatively, or in addition, the first and second amounts may be step amounts that are adjustable by the console based on past operational performance, the nature of the audio input signals, or any other parameters.

The previously described audio mixing console may be used with user adjustable parameters to set the sensitivity and the aggression of the gain adaptation to suit local conditions, environments or requirements. The example audio processing circuits included in the audio mixing console may be employed in a variety of audio signal processing systems and can help to reduce damage to speaker components that could occur in higher distortion environments. Furthermore, a maximum gain is possible without compression or changing of the desired overall system gain. The gain at the first amplifier can be reduced by a defined number of dB while also increasing the trim, or gain, by a corresponding number of dB at the second amplifier.

Figure 7:
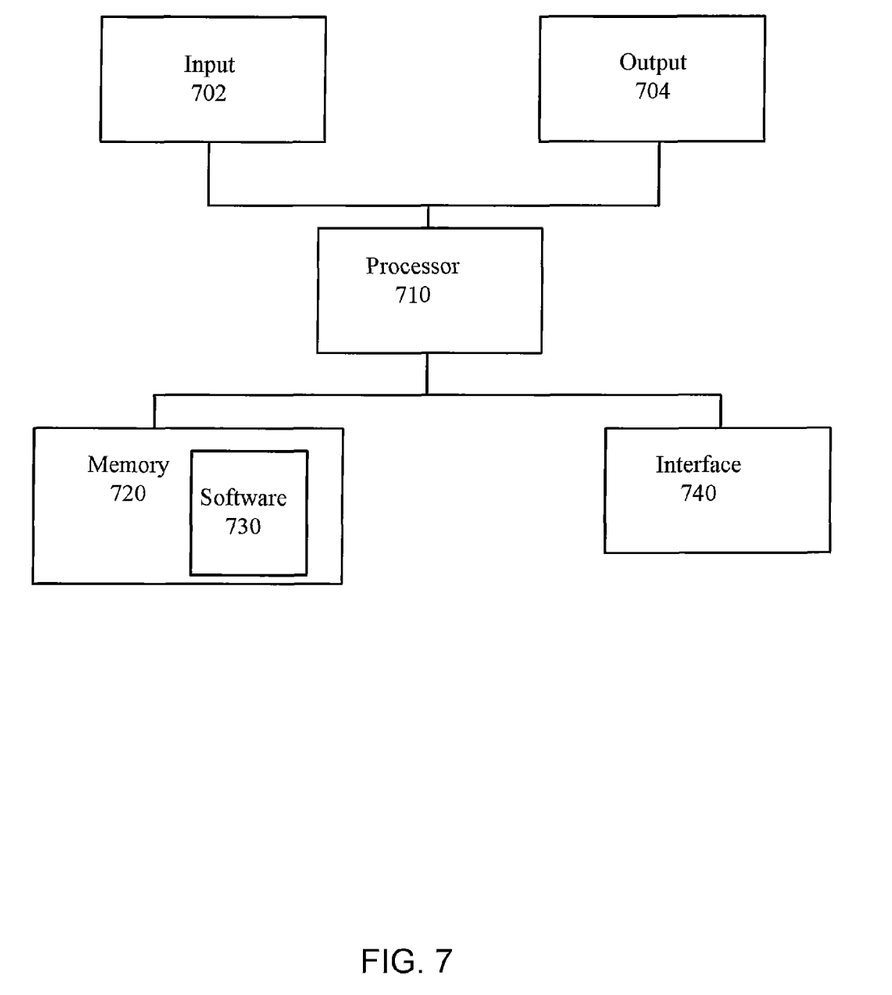
FIG. 7 is an example schematic of an audio mixing console.

FIG. 7 is an example of an audio mixing console 700. In addition to one or more inputs 702 and one or more outputs 704, the console 700 may include a processor 710, a memory 720, software 730, and an interface 740. The console 700 may include analog signal processing and digital signal processing capability.

The processor 710 may include one or more devices capable of executing instructions to perform one or more operations within the console 700. In FIG. 7, the processor 710 is incorporated into the console 700. The processor 710 may be one or more general processors, digital signal processors (DSP), application specific integrated circuits (ASIC), field programmable gate arrays (FPGA), server computers, networks, digital circuits, analog circuits, combinations thereof, or other now known or later developed devices for analyzing and processing digital and analogue data. The processor 710 may operate in conjunction with a software program, such as instructions or code and data stored in the console 700.

The processor 710 may be coupled with memory 720, or memory 720 may be a separate component. Software 730 may be stored in memory 720. Memory 720 may include, but is not limited to, computer readable storage media such as various types of volatile and non-volatile storage media, including random access memory, read-only memory, programmable read-only memory, electrically programmable read-only memory, electrically erasable read-only memory, flash memory, magnetic tape or disk, optical media and the like. The memory 720 may include a random access memory for the processor. Alternatively, the memory 720 may be separate from the processor, such as a cache memory of a processor, the system memory, or other memory. The memory may be an external storage device or database for storing recorded data. Examples include a hard drive, compact disc ("CD"), digital video disc ("DVD"), memory card, memory stick, floppy disc, universal serial bus ("USB") memory device, or any other device operative to store data. The memory 720 may be operable to store instructions executable by the processor.

The console 700 may have an interface 740. The interface 740 may include knobs, switches, sliding components, buttons, a mouse, keyboard, a display, a touch screen or other devices or mechanisms capable of receiving user inputs for adjusting, modifying or controlling one or more features of the console 700 and providing outputs sensed by a user. The interface 740 may be used to manipulate one or more characteristics, components, or features of the console 700. For example, the console 700 may include a slider which, when moved, modifies the volume for one or more of the received signals processed by the console. In another example, the interface 740 may include a knob, that when turned, modifies the gain applied by one or more amplifiers in the console 700. In still another example, the interface 700 may be a data input location displayed in a display and a corresponding data input device in which parameters, such as a gain, a threshold, or any other parameter may be entered by a user of the console 700.

The functions, acts, tasks, and/or components described herein may be performed or represented by a programmed processor executing instructions stored in memory. The functions, acts or tasks may be independent of the particular type of instruction set, storage media, processor or processing strategy and may be performed by software, hardware, integrated circuits, firm-ware, micro-code and the like, operating alone or in combination. Likewise, processing strategies may include multiprocessing, multitasking, parallel processing and the like. A processor may be configured to execute the software.

While various embodiments of the invention have been described, it will be apparent to those of ordinary skill in the art that many more embodiments and implementations are possible within the scope of the invention. Accordingly, the invention is not to be restricted except in light of the attached claims and their equivalents.

I claim:

1. An audio mixing console comprising:
 a first amplifier configured to receive an analogue audio input signal, the first amplifier further configured to amplify the received analogue audio input signal with a first adjustable gain;
 an analogue to digital converter configured to receive the amplified analogue audio input signal, the analogue to digital converter further configured to generate a digital audio signal by an analogue to digital conversion of the analogue audio signal;
 a second amplifier configured to receive the digital audio signal, the second amplifier further configured to amplify the received digital audio signal with a second adjustable gain; and
 a gain range control unit configured to identify a signal level overload at the analogue to digital converter, reduce the first adjustable gain at the first amplifier by a first amount, and increase the second adjustable gain at the second amplifier by the first amount so that an overall gain of the first and second amplifiers is preserved,
 where the gain range control unit is configured to identify the signal level overload by a determination that the signal level of the digital audio signal is higher than a predefined first threshold, and that a number of consecutive audio signal samples that are above the predefined first threshold is higher than a predefined second threshold, and where the gain range control unit is further configured to interpolate a signal level evolution of the digital audio signal using a signal evolution of a predefined number of last detected signal samples, and determine an amount the digital audio signal would be higher than the predefined first threshold, the gain range control unit being further configured to reduce the first adjustable gain by the determined amount and to increase the second adjustable gain by the determined amount.

2. The audio mixing console according to claim 1, where the gain range control unit is further configured to estimate an amount of the signal level overload in response to detection of the signal level overload, the first adjustable gain at the first amplifier reduced in dependence on the estimate.

3. The audio mixing console according to claim 1, where the gain range control unit is further configured to interpolate the signal level evolution as a function of at least one of a rise time of the digital signal in the predefined number of last detected signal samples or a number of detected signal samples above the predefined first threshold.

4. The audio mixing console according to claim 1, where the gain range control unit is further configured to determine a first amount of gain reduction so that the signal level of the digital audio signal at the analogue to digital converter is below a predefined peak signal level.

5. The audio mixing console according to claim 1, further comprising a digital signal processor, where the second amplifier is contained in the digital signal processor.

6. The audio mixing console according to claim 1, where the analogue to digital converter and the second amplifier are directly connected such that the digital audio signal generated by the analogue to digital converter is directly input into the second amplifier.

7. The audio mixing console according to claim 1, where the audio input signal is routed to a plurality of output points of the audio mixing console.

8. The audio mixing console according to claim 1, where a plurality of audio input signals are routed to a single output point of the audio mixing console.

9. A method for operating an audio mixing console, the method comprising the steps of:
    amplifying, by a first amplifier, an analogue audio input signal with a first adjustable gain;
    converting, by an analogue to digital converter, the amplified analogue audio input signal to a digital audio signal, the digital audio signal being directly fed to a second amplifier, where the digital audio signal is amplified with a second adjustable gain;
    identifying a signal level overload at the analogue to digital converter;
    reducing by a first amount, in response to the signal level overload, the first adjustable gain at the first amplifier; and
    increasing by the first amount, in response to the signal level overload, the second adjustable gain at the second amplifier so that an overall gain of the first and second amplifiers is substantially preserved,
    where identifying the signal level overload further comprises interpolating a signal level evolution using a predefined number of last detected signal samples of the digital audio signal and determining an amount the digital audio signal would be greater than a predefined first threshold, wherein the first gain is reduced by the determined amount and the second gain is increased by the determined amount, and
    where interpolating the signal level evolution further comprises interpolating as a function of at least one of a rise time of the digital audio signal in the predefined number of last detected signal samples or a number of signal samples above the predefined first threshold.

10. The method according to claim 9, where reducing by the first amount further comprises estimating an amount of the signal level overload, and reducing the first adjustable gain by the first amount based on an estimated signal level overload.

11. The method according to claim 9, where identifying the signal level overload further comprises determining whether the signal level of the digital audio signal is above a predefined first threshold, determining whether a number of consecutive audio signal samples above the predefined first threshold is greater than a predefined second threshold, and detecting the signal level overload when the number of consecutive samples above the first predefined threshold is greater than the second predefined threshold.

12. The method according to claim 9, where reducing by a first amount comprises determining a first amount of gain reduction to reduce the signal level of the digital audio signal at the analogue to digital converter below a predefined peak signal level.

13. The method according to claim 9, further comprising detecting that the signal level overload is still present at the analogue to digital converter after the gain at the first amplifier has been reduced by the first amount, and further reducing the first gain at the first amplifier and increasing the second gain at the second amplifier until the signal level overload is no longer detected.

* * * * *